(12) United States Patent
Morales et al.

(10) Patent No.: US 7,008,737 B2
(45) Date of Patent: Mar. 7, 2006

(54) GRAY SCALE X-RAY MASK

(75) Inventors: Alfredo M. Morales, Livermore, CA (US); Marcela Gonzales, Seattle, WA (US)

(73) Assignee: Sandia National Laboratories, Livermore, CA (US)

( * ) Notice: Subject to any disclaimer, the term of this patent is extended or adjusted under 35 U.S.C. 154(b) by 0 days.

(21) Appl. No.: 10/804,771

(22) Filed: Mar. 19, 2004

(65) Prior Publication Data

US 2004/0173871 A1    Sep. 9, 2004

Related U.S. Application Data

(62) Division of application No. 10/146,421, filed on May 14, 2002, now Pat. No. 6,749,997.

(51) Int. Cl.
*G03F 7/20* (2006.01)
*G03F 9/00* (2006.01)

(52) U.S. Cl. ............................ 430/5; 430/22; 430/296; 430/313; 430/966

(58) Field of Classification Search .................. 430/5, 430/22, 296, 313, 966
See application file for complete search history.

(56) References Cited

U.S. PATENT DOCUMENTS

| | | | | |
|---|---|---|---|---|
| 4,436,797 A | * | 3/1984 | Brady et al. | 430/5 |
| 5,004,673 A | * | 4/1991 | Vlannes | 430/325 |
| 5,757,879 A | * | 5/1998 | Joshi et al. | 378/35 |
| 6,060,387 A | * | 5/2000 | Shepela et al. | 438/630 |

OTHER PUBLICATIONS

Chou, S. Y., Maluf, N. I.; Peasea, R. F. W.;"High-resolution and high-fidelity x-ray mask structure employing embedded absorbers", *Journal of Vacuum Science and Technology*, B v.6 (6), pp. 2202-2206, Nov./Dec. 1988.

* cited by examiner

Primary Examiner—Nicole Barreca
(74) Attorney, Agent, or Firm—Timothy P. Evans

(57) ABSTRACT

The present invention describes a method for fabricating an embossing tool or an x-ray mask tool, providing microstructures that smoothly vary in height from point-to-point in etched substrates, i.e., structure which can vary in all three dimensions. The process uses a lithographic technique to transfer an image pattern in the surface of a silicon wafer by exposing and developing the resist and then etching the silicon substrate. Importantly, the photoresist is variably exposed so that when developed some of the resist layer remains. The remaining undeveloped resist acts as an etchant barrier to the reactive plasma used to etch the silicon substrate and therefore provides the ability etch structures of variable depths.

8 Claims, 5 Drawing Sheets

GRAY SCALE X-RAY MASK

CROSS REFERENCE TO RELATED APPLICATIONS

This application is a divisional application prior U.S. patent application Ser. No. 10/146,421 originally filed May 14, 2002 now U.S. Pat. No. 6,749,997.

STATEMENT OF GOVERNMENT INTEREST

The United States Government has rights in this invention pursuant to Contract No. DE-AC04-94AL85000 between the United States Department of Energy and Sandia Corporation, for the operation of the Sandia National Laboratories.

BACKGROUND OF THE INVENTION

1. Field of the Invention

The present invention relates to a lithographic mask capable of providing regions of graded exposure, such that when combined with anisotropic etching provides three dimensional microstructures of arbitrary size and shape (generally non-prismatic). The present invention also relates to a method for producing a gray-scale x-ray mask and fabricating a tool useful in the preparation of plated molds, or embossing stamps, for printing fine structures into plastic substrates.

2. Description of Related Art

A variety of methods are presently known for making microparts. In particular, U.S. Pat. No. 5,501,893 to Laermer, et al., describe a lithographic technique for etching silicon, generally referred to as "anisotropic etching," where it is possible to achieve deeply-extending trenches while simultaneously providing side walls which are as nearly parallel and vertical as desired. In particular, Laermer, et al., ('893) teach a multi-step, two stage process for alternately etching an exposed silicon surface in a reactive ion plasma followed by coating the etched surfaces with a thin polymerized layer, wherein the polymer coating serves to protect the wall surfaces of the trench from action of the plasma.

Commonly owned U.S. patent application Ser. No. 09/636,002, filed Aug. 9, 2000 now U.S. Pat. No. 6,477,225 and herein incorporated by reference, discloses a method for preparing an x-ray mask prepared by utilizing an anisotropic deep etching technique. The x-ray mask of the '002 application discloses an x-ray absorbing structure incorporated into the bulk thickness of a standard silicon wafer to provide a robust processing mask capable of withstanding repeated handling.

Finally, U.S. Pat. No. 6,075,650 discloses to prepare a photoresist with a spatially variable dose of electromagnetic radiation to create a surface-relief structures upon developing the exposed resist. The '650 patent also discloses a gray scale mask exposure method, and methods incorporating moving apertures. Not disclosed, however, is a description or suggestion for creating a metal stamping tool by utilizing an etched substrate as a plating base.

SUMMARY OF THE INVENTION

It is known that a standard lithographic mask is an essentially binary tool for imprinting an image into the cross section of a thin uniform photosensitive layer covering a substrate. (The mask is described as "binary" in that radiation from a light source either reaches the surface of the photosensitive layer or is "masked" or blocked and prevented from reaching that surface.) When such an image is developed, the resultant pattern comprises a two dimensional replication of the mask image and if the pattern is transferred into the substrate by etching the result yields features having the same depth/height.

More recently, commercial "gray-scale" masks have become available that provide graded exposure in individual feature within patterns of features. Such masks are, however, quite fragile and difficult to handle.

What is needed is a simple method for providing microstructures that smoothly vary in height from point-to-point in etched substrates, i.e., structure which can vary in all three dimensions. Also needed is a simple, so-called "gray-scale" mask wherein the mask structures have variable attenuating properties from point-to-point across the mask surface. Such a mask could be used to provide etched features in silicon having arbitrary three dimensional shapes which could themselves be used as a final device or as a plating base for providing a metal embossing stamp.

It is, therefore, an object of this invention is to provide a silicon wafer having arbitrary three dimensional microstructures etched into a surface of the wafer.

Another object of this invention is to provide a process for fabricating highly accurate, three dimensional metal embossing tools.

Yet another object of the invention is to provide an x-ray mask having an embedded metal pattern whose thickness varies from point-to-point to provide varying amounts of attenuation of x-ray radiation striking the pattern in a direction parallel to the metal thickness.

Yet another object of this invention is to provide a simple method for fabricating a gray scale mask useful for ultraviolet and for x-ray radiation.

DETAILED DESCRIPTION OF THE INVENTION

Figure 1A:
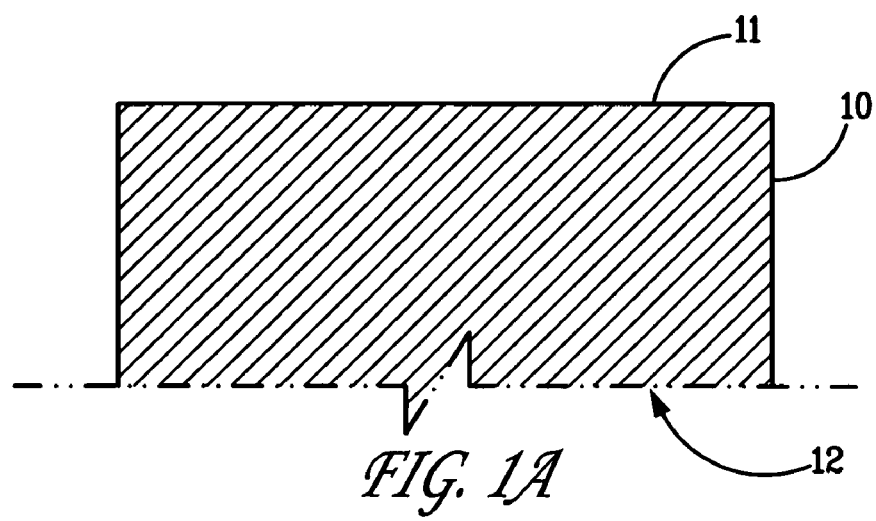
FIG. 1A shows the first step in an embodiment of the present method wherein a silicon substrate wafer, or the like, is provided.

The present invention describes a process for fabricating three dimensional imprint tools. Also described is a gray-scale mask for replicating the image of these three dimensional tools.

In order to achieve these and the other objects of the invention a process is described wherein an image is transferred into a photoresist material in such a manner as to create an exposure gradient across those portions of the resist exposed to radiation. The process otherwise teaches using known lithographic techniques to expose a pattern into a thin layer of photoresist applied to a silicon substrate. The exposed image is developed to remove a portion of the photoresist (positive resists) from the surface of the silicon, and the substrate etched by a reactive plasma technique in those regions free of the resist in order to provide a series of trenches on the silicon surface. (It should be noted that because negative resists react to light exposure by cross-linking the polymer comprising the resist at the top surface rendering exposed portions insoluble in the development solution, this class of photoresists are generally unsuitable for the present invention since the resist cannot be "partially" exposed.).

The invention, therefore, generally provides a method for the fabrication of an imprint tool master and for producing a gray-scale x-ray mask incorporating radiation attenuating structures which vary, respectively, along and across the length and width of the structures. Such a articles would have great utility for production of metal and ceramic microparts.

General Description

This invention describes a metal structure formed in a lithographic process using a silicon wafer. The resultant device can be either an x-ray mask having unusual gray-scale capabilities or, if the silicon substrate support is removed, an embossing tool having non-prismatic surface structures difficult to duplicate by other methods.

The process begins with a standard silicon substrate. A layer of a polymer photoresist is placed onto a top surface of substrate such that the layer is less than about 2 microns thick. Any technique for applying such layers may be used, including dipping, spraying, spinning or vapor depositing, and either organic or inorganic resists may be used. The method of application and composition of the resist is not critical except for the need to restrict the method to the so-called "positive" photoresists.

The resist layer is baked, or otherwise cured, and the desired image pattern rendered onto the layer top surface by using any of a number of conventional lithographic processes. Typically these may include the use of a contact "gray-scale" transmission mask, imaging a reflected mask image through camera optics onto the resist surface, or by directly "writing" the image by using a programmable e-beam writer.

Since the resist coating will act as an etchant barrier during subsequent processing, the amount of protection needed will be determined by the processing necessary to provide the desired structure. Different combinations of resist compositions provide additional options. Furthermore, by controlling the cumulative radiation exposure dose across the surface of the resist layer it is possible to control the thickness of the resist layer at any point on the substrate surface after development. A means, therefore, is provided for generating a retained resist layer having variable thickness from point-to-point across the substrate surface. Because this retained layer will be utilized as an etchant barrier in subsequent processing the ability to control the thickness of the resist allows one to control the final etched structure.

In the present case, a thin polymer resist is placed directly onto a silicon substrate, cured, masked and exposed to broadband light. Such a structure can provide about a 50-to-1 processing-protection ratio against various etching media; a sufficiently robust etchant barrier to allow etching deep, narrow, channel structures in the silicon substrate. A composite resist comprising a thin layer of conventional polymer resist may be applied over a thin silicon dioxide layer grown onto the silicon substrate, where UV light is used to create the image pattern. Such resists permit direct transfer of the image into a silicon dioxide (glass) "hard" resist which provides a processing protection ratio of 200-to-1 which is about equivalent to the former resist barrier since the glass resist layer is much thinner, typically about 100 nm.

After rendering, or "writing," an image into the resist, the resist layer is chemically "developed" to remove the exposed areas of the resist. The patterned substrate is then exposed to a series of anisotropic etching steps utilizing a reactive plasma, such as set forth in the so-called BOSCH process described in U.S. Pat. No. 5,501,893, herein incorporated by reference, in its entirety. In this, or any similar anisotropic processes, the exposed surfaces of the silicon substrate are subjected to a step-wise process comprising first etching with a reactive plasma and then coating the substrate surfaces with a thin polymer layer that protects the walls of the growing etched trenches. Areas of the substrate covered by the retained resist layer are protected from the action of the plasma because, although eroded by the action of the plasma, the retained resist layer is degraded and removed far more slowly then the unprotected substrate.

However, by controlling the cumulative radiation exposure dose across the surface of the resist layer it is possible to control the thickness of the resist layer from point-to-point after development and therefore provide a variable etchant barrier to the reactive plasma. This coupled with adding a second plasma etching step utilizing a different gas chemistry in order to accelerate plasma interaction with the resist layer it becomes possible to control the rate at which the resist layer and the underlying silicon is consumed. In particular, it has been discovered that by changing the composition of the incoming gas stream used to form the plasma to include predominately oxygen, erosion of the resist layer is markedly increased.

The anisotropic etching process proceeds in this manner, irregularly alternating between the steps of etching and coating the exposed silicon, and the added step of etching the variable photoresist layer, until the overall desired etch depth is achieved (herein between about 10 to 30 microns or more). By utilizing the additional step of the modified plasma gas chemistry with the variable thickness resist structures it is possible to form etched structures in the silicon substrate having non-prismatic and/or smooth surfaces extending a different depths into the etched substrate.

After etching the silicon substrate, the remaining resist is stripped away and the substrate cleaned after which a "seed" layer of about 25 nanometers of chromium followed by about 80 nanometers of gold is vapor deposited onto the entire surface. Alternately, this layer may be omitted if the substrate used is a doped, highly conductive, form of silicon.

In either case, a second thicker metal layer is deposited onto the etched surface of the silicon substrate so as to completely fill and cover the etched structures and to provide a thick "backing layer" in the case where the plated member is to be used as an embossing tool. Coating is typically done by electroplating or by electroless deposition onto the "seed" layer but may be done by any method providing the applied layer is uniform in composition and structure and provides a continuous, condensed layer. The second, thick layer may be laid down, for instance, by continuing the vapor deposition of the "seed" layer, by plasma spraying, or by epitaxy deposition. Time and cost, however, tend to favor a conventional electroplating process.

Where the structure is to be used as an embossing "master" the silicon substrate is etched away to leave only the deposited metal structure and the backing layer deposited over the surface of the silicon substrate.

Where the tool is intended to function as an x-ray mask, it is planarized, by lapping the plated surface of the substrate to remove the metal "backing" layer from this surface and leaving a fine metal structure embedded into the thickness of the silicon substrate forming an imaging pattern comprising a gold (or other similar x-ray opaque material) "ribbon" structures extending to a depth of 10 microns or more.

Specific Description

An embodiment of the steps of the invention are described with reference to FIGS. 1 through 4.

As required, detailed embodiments of the present invention are disclosed herein. However, it is to be understood that the disclosed embodiments are merely exemplary of the present invention which may be embodied in various systems. Therefore, specific details disclosed herein are not to be interpreted as limiting, but rather as a basis for the claims and as a representative basis for teaching one skilled in the art to variously practice the present invention.

Referring to FIG. 1A, the process begins with a silicon substrate or wafer 10. In particular, the present invention is most easily implemented by using an industry standard 100 mm Ø×0.67 mm thick wafer. This substrate can have any useful shape and thickness but a thin wafer having parallel top and bottom surfaces 11 and 12 is generally selected due to their ready availability. These surfaces are prepared for processing by treating them in a standard PIRANHA wet etchant ($H_2SO_4$:$H_2O_2$) followed by a 30 second dip in a buffered hydrofluoric acid solution to clean the surfaces of any oxide layer. The cleaned wafer is then spray-coated with a solution comprising 10 volume percent of hexamethyldisilane (HDMS) in propylene glycolmethylethylacetate (PG-MEA) in order to provide a photoresist adhesion layer. The coated wafer is immediately spun to 3000 rpm for about 30 second and then baked for two minutes at 90° C.

Figure 1B:
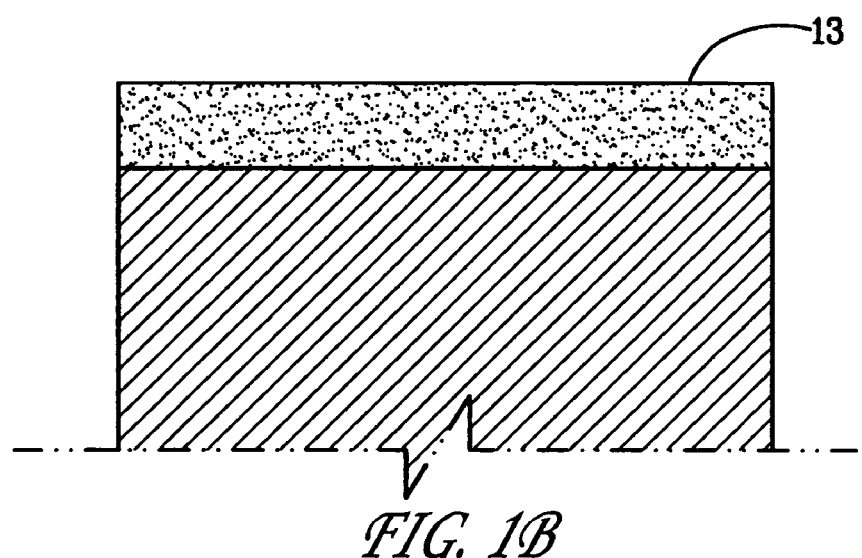
FIG. 1B illustrates the application of a photoresist film onto a top surface of the substrate wafer.

In FIG. 1B a NOVOLAK-based liquid photoresist film 13 (herein OCG 825) is applied by spin coating to a thickness of about 1.8 microns or less, and then baked at a temperature of 90° C. for about 5 minutes in order to at least partially cure the resist layer. The particular resist thickness is chosen so as to balance the need for providing a thick enough layer to protect the unexposed portions of the silicon substrate from the effects of the later ion etch phase against the desire to fully expose the full thickness of the resist during the light exposure phase.

Figure 1C:
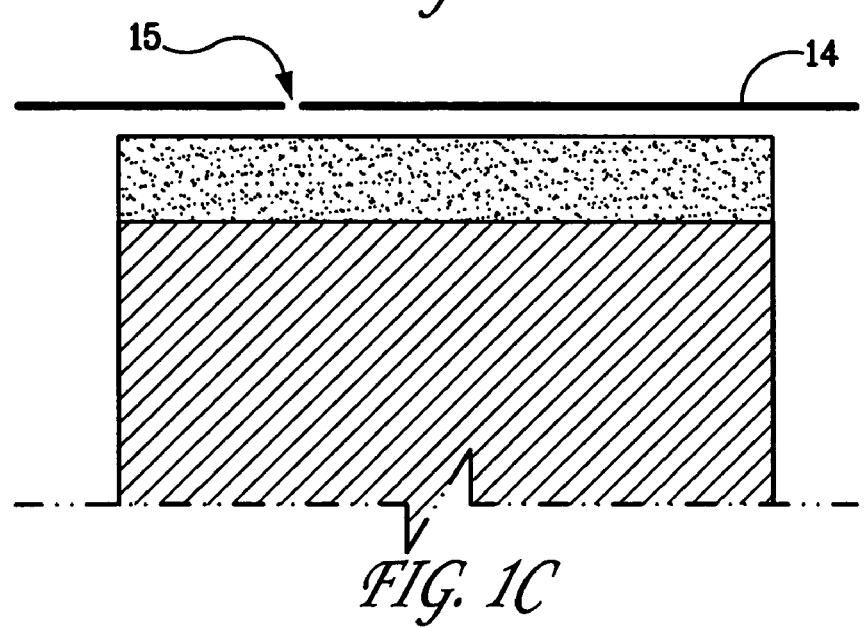
FIG. 1C shows the placement of a negative(positive) trace image of a desired pattern on the photoresist.

In a next step, shown in FIG. 1C, a contact type lithographic mask 14, is placed directly on the surface of the of resist layer 13 (FIG. 1C intentionally shows mask 14 above this surface for clarity sake only). Depending upon the desired pattern, mask 14, comprises a precision aperture 15; either a circular or elliptical pin-hole, a rectilinear "line," or an opening configured to provide a generally square illumination pattern, as described in commonly owned U.S. Pat. No. 5,870,176, and herein incorporated by reference in its entirety.

Figure 1D:
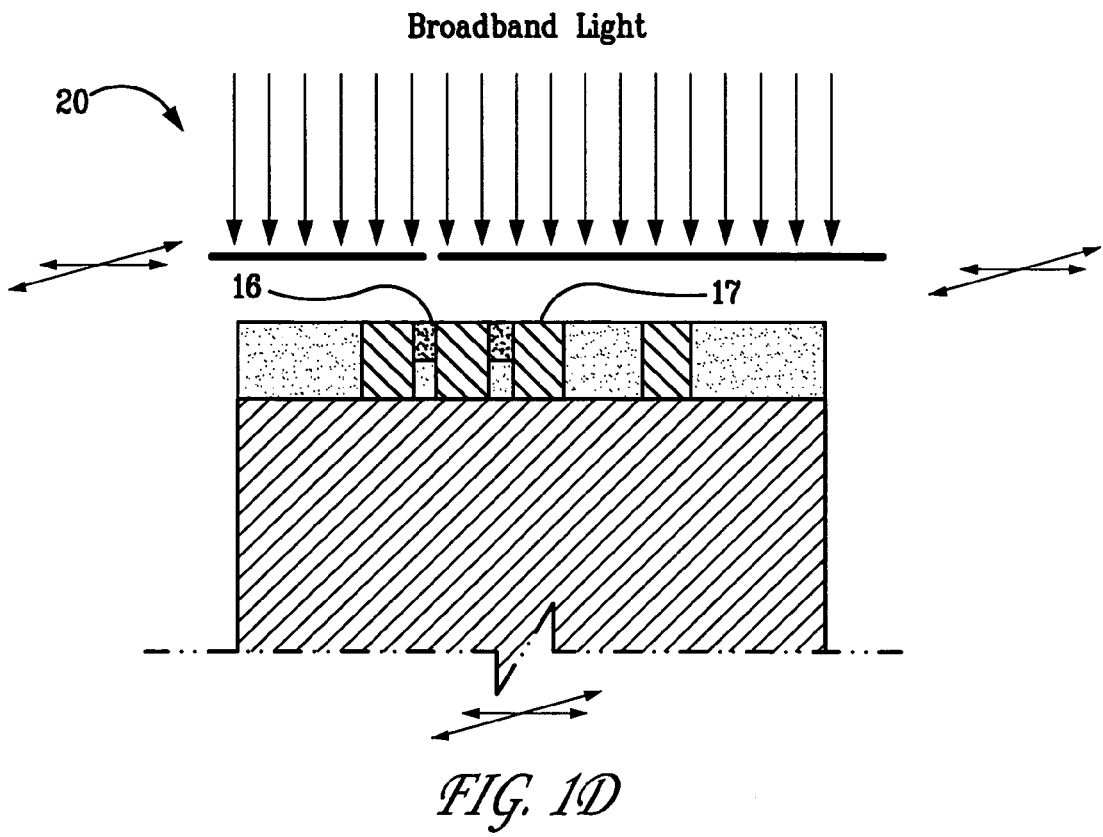
FIG. 1D a shows the exposure of the uncovered portions of the photoresist film to a source of radiation in order to transfer a positive(negative) image of the trace image into the photoresist.

In FIG. 1D the exposed portions, e.g. 16 and 17, of the resist layer 13 are subjected to a source (not shown) of broadband light, 20. The resist exposure source used herein was a high pressure mercury-vapor lamp emitting light over a spectral range of about 365 nm to 450 nm and providing a dose of approximately 80 millijoules/cm$^2$ measured at a wavelength of 365 nm.

Pattern exposure can comprise using a commercially available "gray-scale" mask to expose the resist layer in a single exposure. Alternately, the pattern may be "written" into the resist layer by moving mask 14, and/or substrate 10 in tandem with mask 14, such that mask aperture 15 moves in two axes relative to the plane of the substrate surface 11. By varying the speed at which the precision aperture traverses surface 11, every point on the substrate within a designated exposure area receives a controlled exposure dose of "light" radiation. The resist layer, therefore, can be rendered sensitive to chemical development to a controlled depth at every point on the surface depending on the flux of radiation reaching each point exposed to the radiation and therefore allows an operator to provide a smoothly varying profile in the resist layer.

After developing the exposed resist the practitioner is left with a retained resist pattern exhibiting regions fully removed and regions with varying thickness of photoresist resist remaining on the substrate. This is important because anisotropic plasma etching processes relies on the presence of the remaining layer of resist to act as a temporary barrier to the plasma etchant. Areas under the remaining portion of the photoresist are protected from the plasma composition used to etch the silicon substrate. Additional flexibility is achieved, however, if the etching process is modified to include a third series of etching step to remove varying amounts of the remaining photoresist with iteration of the process.

In particular, if the plasma etchant gas is changed to consist essentially of oxygen, the erosion of the photoresist is greatly accelerated without further silicon etching. By removing the remaining resist in steps the practitioner can achieve a "graded" degree of etching depending on how much of the resist remains each time the resist layer is subjected to the oxygen plasma etch. Those areas that are initially exposed and unprotected by resist will be etched with each cycle of the etching process while those areas that are covered to a greater or lesser extent will be etched in an inverse relationship to the thickness of resist covering each point on the surface each time the added step of oxygen etching is used.

Therefore, to "write" the desired pattern into the resist layer, uniform illumination is directed perpendicular at mask aperture 15 while mask and substrate are moved relative to each other, in a plane parallel to the resist layer, at a speed that is adjusted continuously by a computer algorithm controlling a set of DC stepper motors driving the x and y axes of a translational stage. By controlling the time aperture 15 is maintained over any specific point on the resist layer (by controlling the length and number of "steps" made by the stepper drive motors as it progresses over any fixed distance on the wafer surface) it becomes possible to vary the exposure dose received by the resist layer from point-to-point across the resist surface.

Figure 1E:
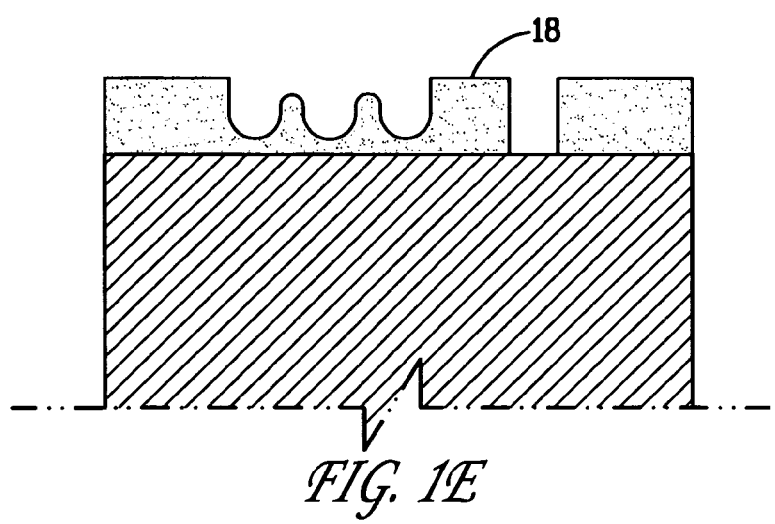
FIG. 1E shows the silicon substrate after portions of the photoresist layer are developed and removed thereby exposing portions of silicon substrate.

After exposure, as illustrated in FIG. 1E, the photoresist layer is chemically "developed" and exposed portions, 16 and 17, of photoresist layer 13 are removed to a thickness proportional to the exposure dose received and thus providing patterned resist layer 18. The developer used in the present invention was OCG 934. The photoresist coated wafer is dipped into the developer for about 20 seconds and then rinsed in deionized water. After developing the resist layer the silicon wafer comprises areas that are completely free of the resist and areas that have various thickness of the undeveloped resist layer remaining.

After drying the developed resist, the now patterned resist layer 18 is subjected to a multi-step anisotropic etching process. The process used in the present invention employs a low pressure reactive plasma 30 for etching silicon, comprising principally sulfur hexafluoride, followed by a second low pressure plasma for etching the photoresist, consisting essentially of oxygen. Both etching steps are carried out at pressures of about 20–50 mTorr, for between about 2 to about 10 second. Parameters used for etching the substrates of the present invention are shown below in Table 1.

TABLE 1

PARAMETERS UTILIZED FOR PLASMA ETCHING SILICON SUBSTRATE AND PHOTORESIST LAYER

| Parameter | Silicon Etch | Resist Etch | Polymer Deposition | Units |
| --- | --- | --- | --- | --- |
| Time | 2–7 | 5 | 3 | seconds |
| RF Power | 12 | 14 | 1 | watts |
| ICP Power | 850 | 850 | 850 | watts |
| Pressure | 23 | 43 | 22 | mTorr |
| Ar | 40 | 40 | 40 | sccm |
| $SF_6$ | 50–100 | — | — | sccm |
| $C_4F_8$ | — | — | 70 | sccm |
| $O_2$ | — | 100 | — | sccm |

Because the patterned photoresist layer 18 acts as an etchant barrier to reactive plasma 30, those area of substrate 10 that still retain some of the photoresist layer thickness, will be protected from attack by the plasma. It is this step that provides the very high aspect ratio etched pattern shown in FIG. 2B. As noted supra., the typical BOSCH-type processes comprise a two step etch-and-coat process wherein the intervening coating step comprises coating the exposed silicon with a thin layer of a polymer film generated from a gaseous polymer ($C_4F_8$, octafluro-cyclobutane) which protects the wall surfaces of the etched cavities but is quickly destroyed on those surfaces which directly face the bombardment of the reactive plasma 30 shown in FIG. 2A. This action has the effect of etching hole- or trench-like cavities in the exposed silicon.

However, because the resist exposure has been controlled from point-to-point across its surface the thickness of resist remaining after development varies continuously. This feature is put to use by providing a modified plasma etchant gas reconstituted to attack the remaining photoresist. Some portion of the remaining resist layer is therefore, removed exposing fresh silicon surface and the anisotropic etch begun again. As can be seen from Table 1 then, each etching step proceeds for only a few seconds allowing for rapid and fine control of the etching process that itself affords the ability to etch cavities that likewise vary continuously in both depth and cross-section such that the cavity walls include non-prismatic surfaces and cross section that can be triangular, rectangular, trapezoidal, parabolic or hyperbolic.

The process continues until a desired average etch depth is achieved. In the case of the present invention the desired depths vary between about 10 microns to about 100 microns, but any depth that achieves the stated result, is possible.

Figure 2A:
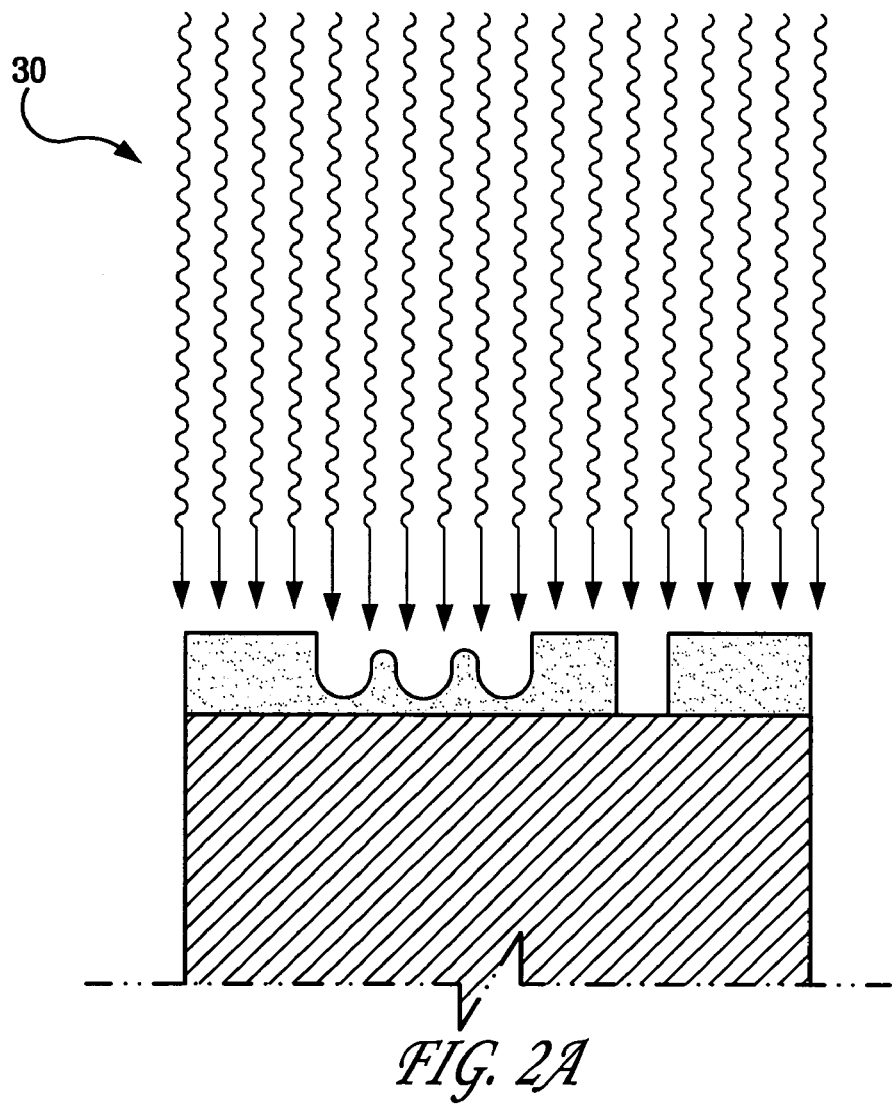
FIG. 2A illustrates the silicon substrate covered by the developed photoresist wherein exposed portions of the substrate are unprotected from the reactive plasma and subjected to etching greatly exceeding etching across those areas covered by resist layer.
Figure 2B:
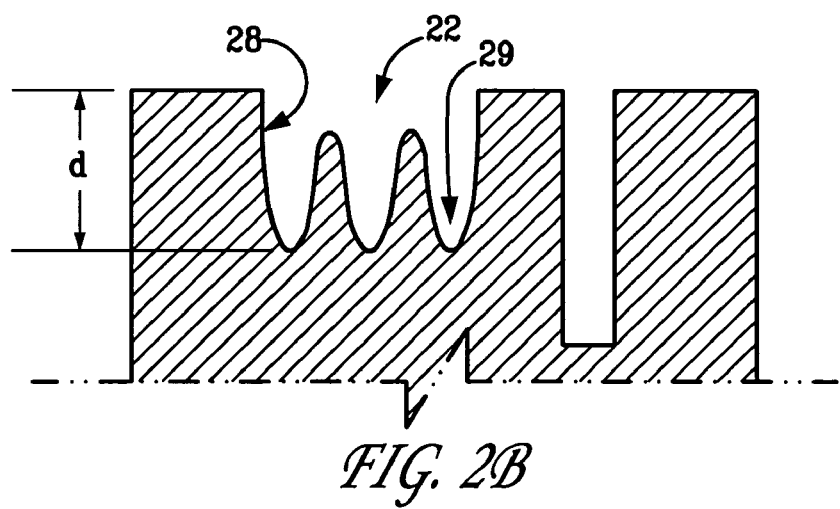
FIG. 2B illustrates the silicon substrate after the exposed portions of the substrate have been deeply etched.
Figure 2C:
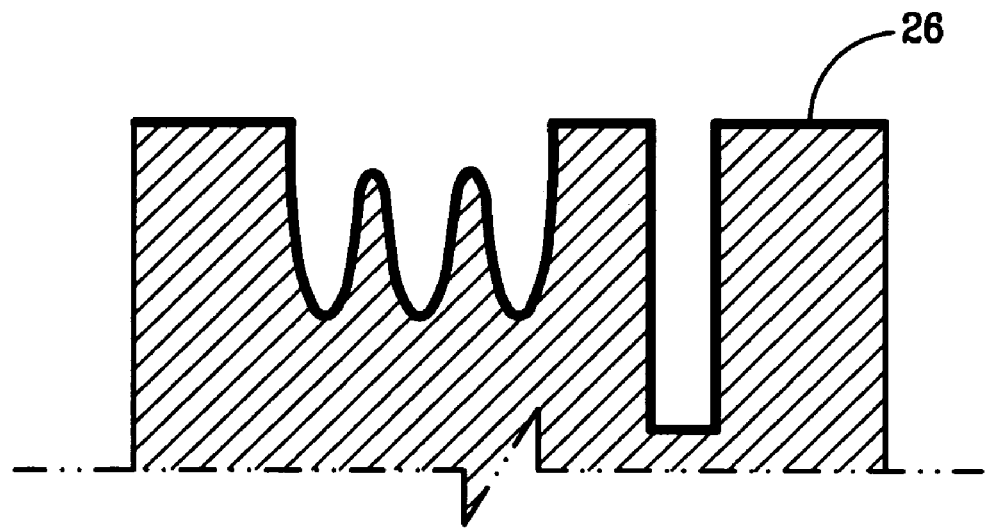
FIG. 2C shows the etched silicon substrate, wherein the remaining photoresist is removed and the substrate coated with a thin conductive coating.

As shown in FIG. 2B, after etching the silicon wafer 10, any remaining resist layer 18 is removed and the part cleaned leaving substrate 10 with a etched cavity 22 across the top surface of the wafer comprised of walls and floors 28 and 29. The entire surface is subsequently covered with a thin, electrically conductive metal film 26, as shown in FIG. 2C, in preparation for a much heavier coating. The chosen process for applying the first thin coating of FIG. 2C is a thermal evaporation or particle vapor deposition (PVD) process, although any other coating process which would provide a thin, continuous layer of conductive material would be equally effective. However, any such processes must be able to coat both the surfaces 28 and 29 of cavities 22. Such methods could include, but are not limited to, sputtering and chemical vapor deposition or spraying coating methods, and only require that the coating process provide a continuous, adherent, and conductive layer.

As disclosed herein, the film 26 is about a 25 nanometers layer of chromium with an overlaying layer of about 80 nanometer of gold. Any similar metal or combination of metals would be useful including most of the metals in the Transition series of metal listed in New IUPAC Group Numbers 4–12 of the Period Table of elements, alloys thereof, and certain metals contained in Groups Numbers 13 and 14, such as aluminum and tin.

Figure 2D:
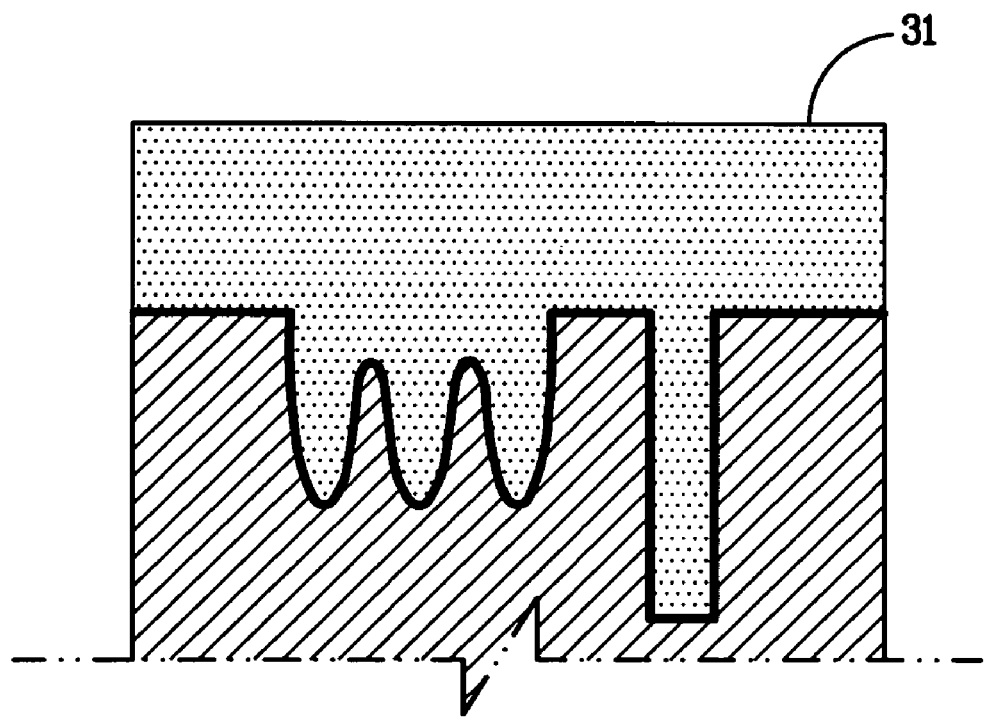
FIG. 2D shows the metal coated silicon substrate having a second thicker layer of a deposited metal such that the etched portions on the substrate are completely filled.

Film 26 enables adherence of a final, thicker metal layer 31 which is deposited in a subsequent step, shown in FIG. 2D. In the present invention, metal layer 31 is nickel or gold but, as before, can be any similar metal selected from the list supplied above.

Figure 3:
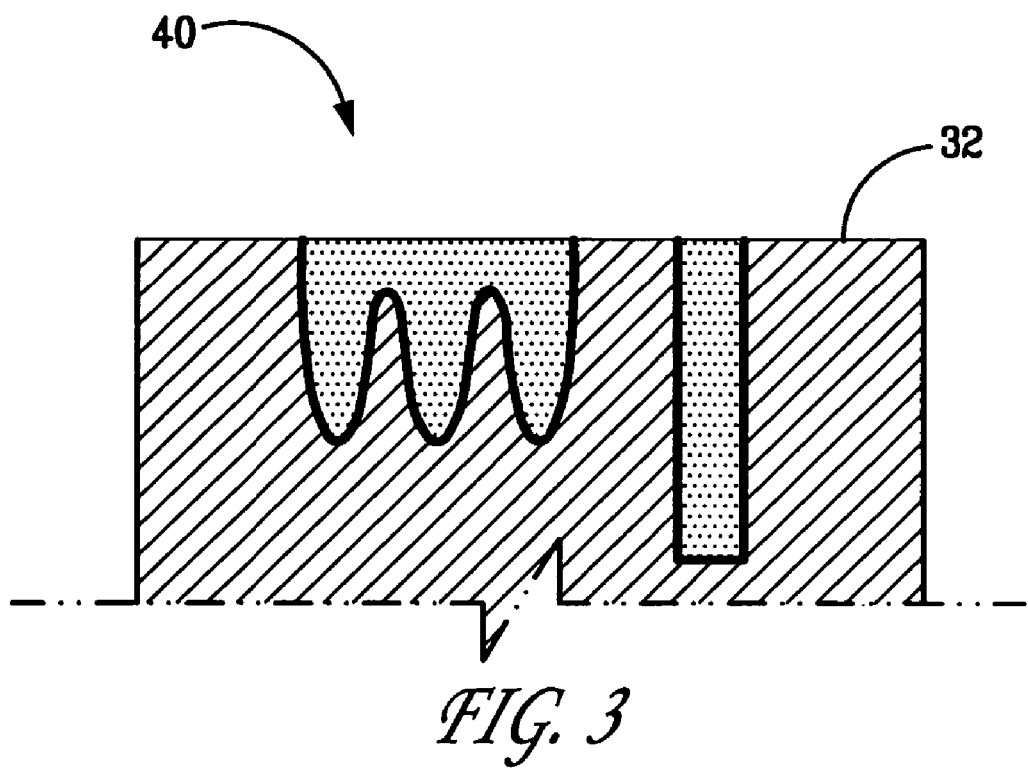
FIG. 3 shows the removal of the excess thick gold layer from the top surface of the silicon substrate by planarizing that surface until the silicon substrate is again exposed thereby providing a variable density n x-ray mask.
Figure 4:
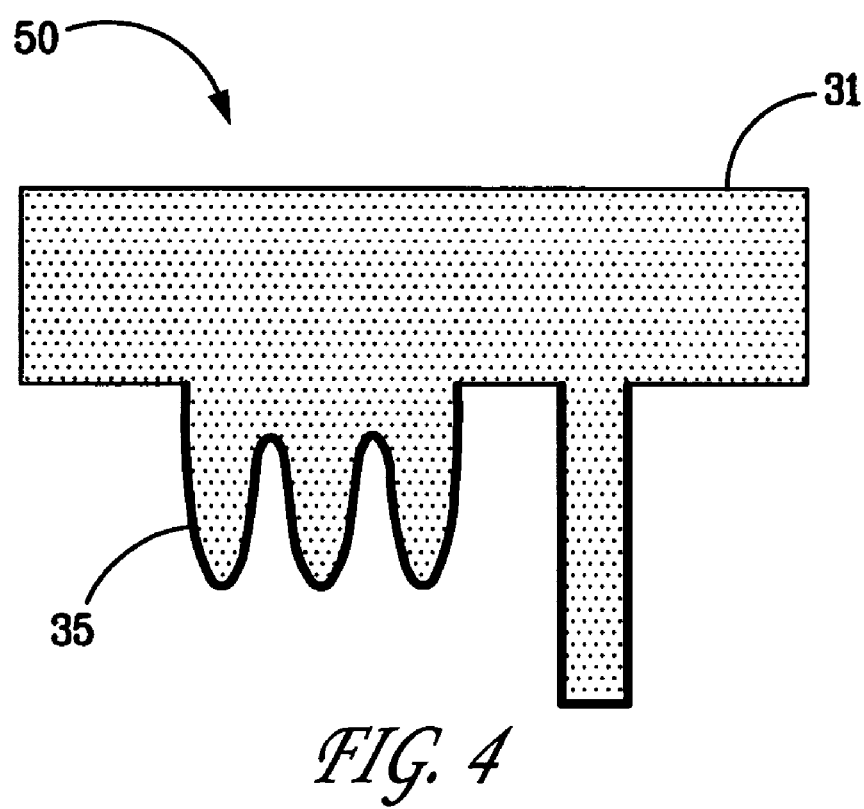
FIG. 4 shows the removal of the removal of the surrounding silicon substrate of the coated device of FIG. 2D to provide an embossing tool comprising the deposited metal layer.

Finally, if article 40 is to be used as a gray-scale mask, as is shown in FIG. 3, then the step of depositing metal layer 31 is followed by a final planarizing step to remove the "backing" portion of layer 31, in order to provide flat, smooth surface 32. The planarizing step is typically performed by lapping until the surface 11 of the silicon is reached leaving the embedded metal pattern 33 exposed. (Planarizing removes the overburden x-ray blocking metal layer on the top surface of the substrate leaving only the metal deposited in the etched cavities.)

Where the tool is to be used as an embossing device, metal layer 31 is not planarized as in FIG. 3. Instead the surrounding silicon substrate is etched away using a standard blanket etching technique leaving only the deposited metal layer including the portion of the layer is deposited into cavities 22. The resultant article, shown in FIG. 4, is embossing tool 50 and comprises a flat metal support layer 31 having a series of 3-dimensional projections 35 of various shapes and sizes.

The foregoing description of the invention has been presented for purposes of illustration and description and is not intended to be exhaustive or to limit the invention to the precise form disclosed. Many modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. An x-ray mask tool, comprising:
   a silicon substrate having a first thickness, a top surface, and a bottom surface substantially parallel to said top surface; and
   a three-dimensional metal structure embedded into said silicon substrate and about flush with said top surface, said three-dimensional metal structure comprising a second thickness less than said first thickness, and one or more regions, wherein said second thickness varies continuously across a length and width of said three-dimensional metal structure thereby providing a floor surface in each of said one or more regions which varies in a curvilinear manner.

2. The x-ray mask tool of claim 1, wherein said metal structure is a metal selected from the group consisting of the Transition series of metals listed in New IUPAC Group Numbers 4–12 of the Period Table of elements, aluminum, tin, and alloys thereof.

3. The x-ray mask tool of claim 2, wherein said metal structure comprises a thin vapor deposited metal layer.

4. The x-ray mask tool of claim 3, wherein said thin vapor deposited metal layer comprises chromium.

5. The x-ray mask tool of claim 3, wherein said metal deposit is deposited by electroplating.

6. The x-ray mask tool of claim 3, wherein said metal deposit is deposited by electroless deposition.

7. The x-ray mask tool of claim 3, wherein said metal deposit is deposited by thermal or particle vapor deposition, or by sputter deposition.

8. The x-ray mask tool of claim 1, wherein said metal structure consists essentially of gold.

* * * * *